United States Patent
Fujii et al.

(10) Patent No.: US 7,612,456 B2
(45) Date of Patent: Nov. 3, 2009

(54) ELECTRONIC DEVICE, SEMICONDUCTOR DEVICE USING SAME, AND METHOD FOR MANUFACTURING SEMICONDUCTOR DEVICE

(75) Inventors: Sadamasa Fujii, Kyoto (JP); Taro Nishioka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 440 days.

(21) Appl. No.: 10/577,450

(22) PCT Filed: Jun. 16, 2005

(86) PCT No.: PCT/JP2005/011009

§ 371 (c)(1), (2), (4) Date: Apr. 27, 2006

(87) PCT Pub. No.: WO2006/016449

PCT Pub. Date: Feb. 16, 2006

(65) Prior Publication Data
US 2007/0075422 A1 Apr. 5, 2007

(30) Foreign Application Priority Data
Aug. 11, 2004 (JP) ............................ 2004-234707

(51) Int. Cl.
*H01L 23/485* (2006.01)
*H01L 23/522* (2006.01)
*H01L 29/41* (2006.01)

(52) U.S. Cl. ................. 257/781; 257/751; 257/753; 257/E23.021; 257/E21.508; 257/E23.041

(58) Field of Classification Search ............. 257/781, 257/753, E23.041
See application file for complete search history.

(56) References Cited

U.S. PATENT DOCUMENTS

| | | | | |
|---|---|---|---|---|
| 5,367,195 A | * | 11/1994 | DiGiacomo et al. | 257/767 |
| 6,011,313 A | * | 1/2000 | Shangguan et al. | 257/778 |
| 6,133,637 A | * | 10/2000 | Hikita et al. | 257/777 |
| 6,249,051 B1 | * | 6/2001 | Chang et al. | 257/737 |

(Continued)

FOREIGN PATENT DOCUMENTS

JP 54-159173 12/1979

(Continued)

OTHER PUBLICATIONS

ASM Handbook, vol. 3, Alloy Phase Diagrams, 1992.*

*Primary Examiner*—David Vu
*Assistant Examiner*—Earl N Taylor
(74) *Attorney, Agent, or Firm*—Rabin & Berdo, P.C.

(57) ABSTRACT

An inventive electronic device includes a substrate, a bump of a first metal material provided on a surface of the substrate, a bonding film of a second metal material provided on a top surface of the bump for bonding the electronic device to an electrical connection portion of a second device, the second metal material having a lower melting point in an elemental state than an alloy of the first metal material and the second metal material, and a diffusion prevention film of a third metal material provided between the top surface of the bump and the bonding film as covering at least part of the top surface of the bump, the third metal material having a lower diffusion coefficient than the second metal material with respect to the first metal material.

10 Claims, 6 Drawing Sheets

U.S. PATENT DOCUMENTS

| | | | |
|---|---|---|---|
| 6,501,185 B1 * | 12/2002 | Chow et al. | 257/780 |
| 6,786,385 B1 * | 9/2004 | Kitajima et al. | 228/8 |
| 2002/0047217 A1 * | 4/2002 | Zakel et al. | 257/781 |
| 2002/0090805 A1 * | 7/2002 | Yap et al. | 438/615 |
| 2003/0075791 A1 | 4/2003 | Shibata | |
| 2003/0141593 A1 * | 7/2003 | Zuniga-Ortiz et al. | 257/750 |
| 2004/0137708 A1 | 7/2004 | Shibata | |
| 2004/0169286 A1 | 9/2004 | Shibata | |
| 2005/0026413 A1 * | 2/2005 | Lee et al. | 438/612 |
| 2005/0151268 A1 * | 7/2005 | Boyd et al. | 257/778 |
| 2005/0224991 A1 * | 10/2005 | Yeo | 257/781 |
| 2006/0016861 A1 * | 1/2006 | Daubenspeck et al. | 228/180.21 |

FOREIGN PATENT DOCUMENTS

| | | |
|---|---|---|
| JP | 62-117346 | 5/1987 |
| JP | 2002-190490 | 7/2002 |
| JP | 2002-289768 | 10/2002 |
| JP | 2003-133508 | 5/2003 |
| JP | 2004-79685 | 3/2004 |

\* cited by examiner

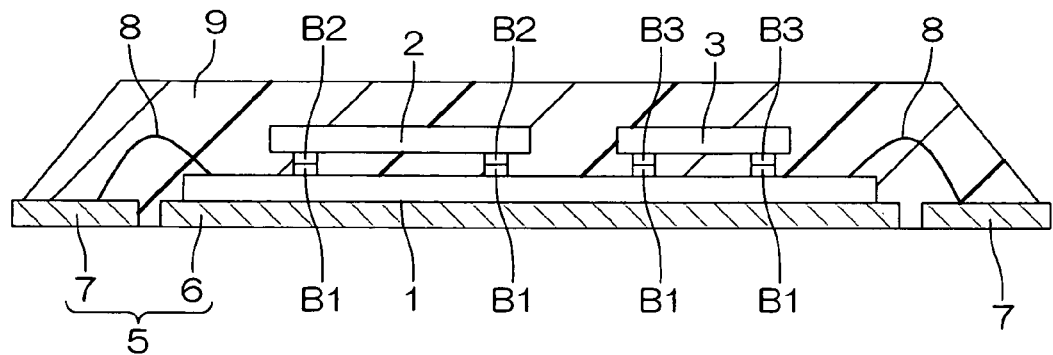
FIG. 1
FIG. 2
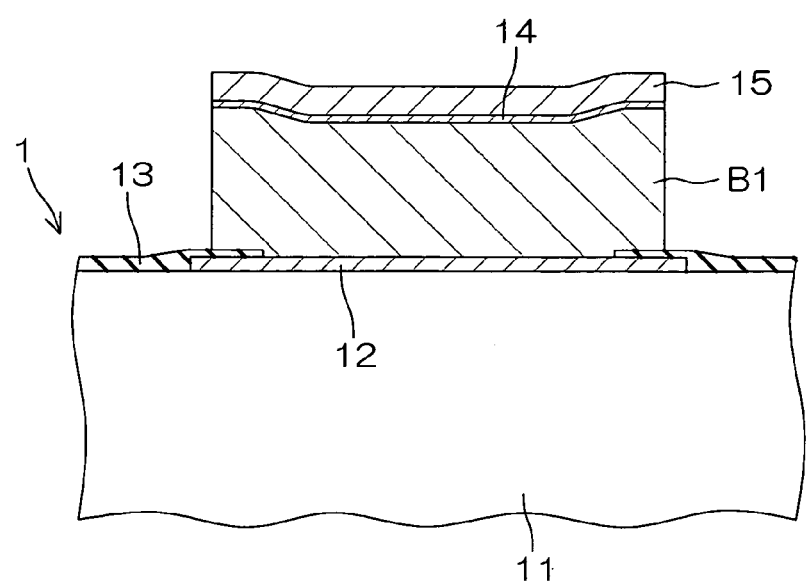

ELECTRONIC DEVICE, SEMICONDUCTOR DEVICE USING SAME, AND METHOD FOR MANUFACTURING SEMICONDUCTOR DEVICE

TECHNICAL FIELD

The present invention relates to an electronic device such as a semiconductor chip or a wiring board, a semiconductor device produced by employing the electronic device, and a semiconductor device production method.

BACKGROUND ART

Semiconductor devices produced by bonding a semiconductor chip onto a second semiconductor chip or by flip-chip-bonding a semiconductor chip onto a surface of a wiring board generally include bumps of gold (Au) or copper (Cu) provided on a surface of the semiconductor chip. As metal bonding films having a lower melting point (fusion temperature) than a bump material, thin films of tin (Sn) or indium (In) are provided on top surfaces of the bumps. When the semiconductor chip is bonded onto the second semiconductor chip or the wiring board to be mated, the metal bonding films are heated to be fused, and then cooled to be solidified. Thus, the devices to be mated are mechanically bonded and electrically connected to each other.

The metal bonding films are desirably formed as having the smallest possible thickness. More specifically, the metal bonding films should have a thickness ranging from 0.1 μm to 5 μm. This is because, if the metal bonding films have a greater thickness, the metal bonding films tend to expand in volume or to be fused and diffused around due to heat generated during use of the semiconductor device to adversely affect other devices, and fusion-bonding stability is liable to be deteriorated.

However, the bump material (specifically, Au or Cu) is an easy-to-diffuse metal. Therefore, the metal bonding films are mostly present in the form of alloy films (e.g., Au—Sn alloy films), which have a melting point (e.g., 280° C.) higher than the melting point of the metal bonding film material in an elemental state (e.g., elemental Sn has a melting point of 232° C.). Accordingly, a high temperature heat treatment is required for the fusion-bonding, thereby arousing concern about adverse effects on the characteristics of the semiconductor chip.

This concern may be eliminated by increasing the thickness of the metal bonding films. In this case, however, the aforementioned problem will occur.

DISCLOSURE OF THE INVENTION

It is an object of the present invention to provide an electronic device which permits fusion-bonding at a relatively low temperature even with a thin bonding film, and a semiconductor device employing the electronic device.

It is another object of the present invention to provide a semiconductor device production method which can bond a semiconductor chip onto a semiconductor substrate while suppressing influences on device characteristics.

An electronic device according to the present invention includes a substrate, a bump of a first metal material (e.g., Au or Cu) provided on a surface of the substrate, a bonding film of a second metal material (e.g., Sn, In or an Sn—In alloy) provided on a top surface of the bump for bonding the electronic device to an electrical connection portion of a second device, the second metal material having a lower melting point in an elemental state than an alloy of the first metal material and the second metal material, and a diffusion prevention film of a third metal material (e.g., TiW) provided between the top surface of the bump and the bonding film as covering at least part of the top surface of the bump, the third metal material having a lower diffusion coefficient than the second metal material with respect to the first metal material.

The term "elemental state" herein means a state in which the second metal material is not alloyed with the first metal material (particularly by mutual diffusion), and includes a state in which the second metal material consists of a single metal element as well as a state in which the second metal material is alloyed with a metal element other than the first metal material.

With the aforementioned arrangement, the bonding film formed on the diffusion prevention film is free from the mutual diffusion of the bump material even if having a smaller thickness. Therefore, the bonding film is kept in the elemental state of the second metal material. Thus, the thin bonding film can be fused at a lower melting point, allowing for fusion bonding at a relatively low temperature when the electronic device is bonded onto the electrical connection portion of the second device.

The second metal material for the bonding film preferably has a lower melting point than the third metal material for the diffusion prevention film.

The diffusion prevention film preferably covers the entire top surface of the bump, and the bonding film is preferably entirely disposed on the diffusion prevention film.

With this arrangement, the mutual diffusion of the bump material and the bonding film material can be assuredly prevented, so that the entire bonding film is kept in the elemental state of the second metal material having a relatively low melting point. This allows for fusion bonding at low temperature.

The diffusion prevention film may cover a part of the top surface of the bump and uncover the rest of the top surface. In this case, the bonding film preferably has a portion present on the diffusion prevention film and a portion contacting the top surface of the bump.

With this arrangement, the portion of the bonding film present on the diffusion prevention film is kept in the elemental state of the second metal material, and the portion of the bonding film contacting the top surface of the bump is present as an alloy film of the first metal material and the second metal material resulting from the mutual diffusion. The portion of the bonding film in the elemental state of the second metal material contributes to the lower temperature fusion bonding, and the portion of the bonding film in the alloy state contributes to improvement of the strength of the bonding between the bump and the bonding film (and hence improvement of the strength of the bonding to the second device to be mated). This makes it possible to achieve the lower temperature fusion bonding while ensuring a sufficient bonding strength.

The substrate maybe a semiconductor substrate, and the electronic device may be a semiconductor chip. With this arrangement, the semiconductor chip is provided whose bump can be fusion-bonded at low temperature.

The substrate may be a wiring board having a wiring conductor provided on an insulating substrate. In this case, the bump is preferably provided on the wiring board and connected to the wiring conductor. With this arrangement, the wiring board is provided whose bump can be fusion-bonded at low temperature. A second electronic device such as a semiconductor chip can be bonded to the wiring board by utilizing the bump.

A semiconductor device according to the present invention is a semiconductor device of a chip-on-chip structure which includes a first semiconductor chip and a second semiconductor chip respectively having bumps and connected to each other with the bumps thereof bonded to each other, wherein at least one of the first semiconductor chip and the second semiconductor chip is the electronic device having the aforementioned construction. With this arrangement, the semiconductor device of the chip-on-chip structure is provided which can be produced by bonding the bumps of the respective chips to each other through a low temperature fusion bonding process.

Another semiconductor device according to the present invention includes a wiring board having a wiring conductor provided on an insulating substrate, and the aforementioned electronic device with the bump thereof opposed to the wiring board and connected to the wiring conductor. With this arrangement, the semiconductor device of a so-called flip-chip bonding type is provided which can be produced by flip-chip-bonding the semiconductor chip onto the wiring board through a low temperature fusion bonding process.

A semiconductor device production method according to the present invention is a method for producing a semiconductor device by bonding a semiconductor chip onto a semiconductor substrate (e.g., a semiconductor wafer) via a bump. The bump is provided on a surface of at least one of the semiconductor substrate and the semiconductor chip, and composed of a first metal material. A bonding film of a second metal material having a lower melting point in an elemental state than an alloy of the first metal material and the second metal material is provided on a top surface of the bump, and a diffusion prevention film of a third metal material having a lower diffusion coefficient than the second metal material with respect to the first metal material is provided between the top surface of the bump and the bonding film as covering a part of the top surface of the bump and uncovering the rest of the top surface. The bonding film has a portion present on the diffusion prevention film and a portion contacting the top surface of the bump. The method includes the steps of temporarily bonding the semiconductor chip onto the semiconductor substrate with the semiconductor chip being placed on the semiconductor substrate with the intervention of the bump by heating the bonding film at a first temperature which is not lower than the melting point of the second metal material in the elemental state and lower than the melting point of the alloy of the first metal material and the second metal material, and firmly bonding the semiconductor chip onto the semiconductor substrate after the temporary bonding step by heating the bonding film at a second temperature which is not lower than the melting point of the alloy of the first metal material and the second metal material.

According to this method, the portion of the bonding film (in the elemental state of the second metal material) on the diffusion prevention film is fused by the heating at the relatively low temperature in the temporary bonding step, whereby the bonding between the semiconductor chip and the semiconductor substrate is achieved. Thereafter, the portion of the bonding film (of the alloy of the first metal material and the second metal material) contacting the top surface of the bump is fused by the heating at the relatively high temperature, thereby compensating for an insufficient strength of the bonding between the bonding film and the diffusion prevention film. Thus, the semiconductor chip can be firmly bonded to the semiconductor substrate.

The firm bonding step is preferably performed after a plurality of semiconductor chips are temporarily bonded onto the semiconductor substrate.

According to this method, the plurality of semiconductor chips temporarily bonded onto the semiconductor substrate are simultaneously subjected to the firm bonding step. Therefore, the time required for the production process can be reduced. In addition, the semiconductor substrate and the semiconductor chips experience the high temperature process a fewer number of times, so that the characteristics of elements formed in the semiconductor substrate and the semiconductor chip can be properly maintained.

A plurality of semiconductor devices of a chip-on-chip structure can be produced, for example, by temporarily bonding a plurality of semiconductor chips onto a semiconductor wafer, simultaneously firmly bonding the plurality of semiconductor chips onto the semiconductor wafer, and cutting (dicing) the semiconductor wafer into a plurality of regions each including a predetermined number of semiconductor chips (one or more semiconductor chips).

The foregoing and other objects, features and effects of the present invention will become more apparent from the following description of the embodiments with reference to the attached drawings.

BRIEF DESCRIPTION OF THE DRAWINGS

FIG. 1 is a schematic sectional view for explaining the construction of a semiconductor device according to one embodiment of the present invention;

FIG. 2 is a sectional view for explaining in detail the structure of a bump provided on a primary chip of the semiconductor device;

EMBODIMENTS OF THE INVENTION

Figure 3A:
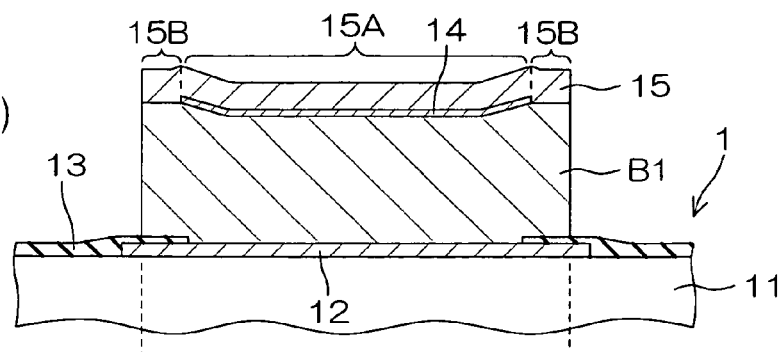
FIGS. 3(a) and 3(b) are a sectional view and a plan view, respectively, illustrating another exemplary structure of the bump.

FIG. 1 is a schematic sectional view for explaining the construction of a semiconductor device according to one embodiment of the present invention. The semiconductor device has a so-called chip-on-chip structure, which includes a primary chip 1 and secondary chips 2, 3 bonded onto the primary chip 1. The primary chip 1 and the secondary chips 2, 3 are semiconductor chips (e.g., silicon chips). The secondary chips 2, 3 are bonded to the primary chip 1 in face-to-face relation with their active surfaces opposed to an active surface (a surface on an active region side formed with elements) of the primary chip 1. More specifically, the primary chip 1 is die-bonded onto an island 6 of a lead frame 5 with its active surface upward, and the secondary chips 2, 3 are bonded onto an upper surface of the primary chip 1 with their faces down. The primary chip 1 has external connection pads (not shown) provided on the active surface thereof, and the pads are electrically connected to leads 7 of the lead frame 5 via bonding wires 8. The primary chip 1, the secondary chips 2, 3, the bonding wires 8, and the lead frame 5 are sealed with a sealing resin 9 to constitute a semiconductor package. The leads 7 are partly exposed from the sealing resin 9, and function as external connection portions (outer lead portions).

The primary chip 1 and the secondary chips 2, 3 each have a plurality of bumps B1, B2, B3 provided on the active surface thereof. The bumps B1 of the primary chip 1 are respectively connected to the bumps B2 of the secondary chip 2 and the bumps B3 of the secondary chip 3. Thus, the primary chip 1 and the secondary chip 2 are electrically connected and mechanically bonded to each other via the bumps B1, B2. Similarly, the primary chip 1 and the secondary chip 3 are electrically connected and mechanically bonded to each other via the bumps B1, B3.

FIG. 2 is a sectional view for explaining in detail the structure of the bump B1 provided on the primary chip 1. The primary chip 1 has a multilevel interconnection structure, for example, provided in a surface of a semiconductor substrate (e.g., a silicon substrate) 11 thereof which is a main body of the primary chip 1. An uppermost interconnection layer (or metal pads) 12 of the multilevel interconnection structure is partly exposed from openings formed in a surface protective film 13. The bumps B1 which are composed of, for example, gold (Au) respectively cover the openings and project from the surface protective film 13. A diffusion prevention film 14 for preventing diffusion of a material for the bumps B1 is provided on the entire top surface of each of the bumps B1, and a bonding film 15 composed of, for example, tin (Sn) is provided on the diffusion prevention film 14. That is, the bonding film 15 is entirely disposed on the diffusion prevention film 14. The bonding film 15 has a thickness of not smaller than 0.1 μm and not greater than 5 μm.

The melting point (232° C.) of the material (Sn) for the bonding film 15 is lower than the melting point of the material (Au) for the bumps B1. Further, the melting point of the bonding film material in an elemental state is lower than the melting point (280° C.) of an alloy (Au—Sn) of the bonding film material and the material (Au) for the bumps B1. The material for the bumps B1 has a lower melting point than a material for the diffusion prevention film 14.

The diffusion prevention film 14 is, for example, a TiW film. The material (TiW) for the diffusion prevention film 14 has a lower diffusion coefficient than the material (Sn) for the bonding film 15 with respect to the material (Au) for the bumps B1. The diffusion prevention film 14 has a thickness of not smaller than 200 Å. If the thickness of the diffusion prevention film 14 is smaller than 200 Å, the prevention of the diffusion of Au and Sn is insufficient.

Formation of the bumps B1 may be achieved by a plating process. Formation of the diffusion prevention films 14 may be achieved by a plating process or a sputtering process. Further, formation of the bonding films 15 may be achieved by a plating process or a sputtering process.

The bumps B2, B3 of the secondary chips 2, 3 are composed of, for example, Au. Like the bumps B1, the bumps B2, B3 may each be formed with a diffusion prevention film and a bonding film but, in general, these films are not necessary.

When the secondary chips 2, 3 are bonded onto the primary chip 1, the bumps B2, B3 are respectively positioned with respect to the bumps B1 with their top surfaces respectively abutting against the top surfaces of the bumps B1. Then, the bonding films 15 are heated at a temperature not lower than the melting point of the bonding film material (Sn), for example, by heating the primary chip 1. Thus, the bonding films 15 are fused. Thereafter, the heating is stopped, and the bonding films 15 are cooled to be solidified, whereby the bumps B2, B3 are respectively bonded to the bumps B1.

By the function of the diffusion prevention films 14, the bonding films 15 provided on the diffusion prevention films 14 are kept in the Sn elemental state without mutual diffusion of the bonding film material and the material for the bumps B1. Therefore, the bonding films 15 can be easily fused by the heating at a temperature (about 232° C.) much lower than the melting point of the Au—Sn alloy. Thus, the bonding can be properly achieved through a low temperature fusion bonding process, so that the characteristics of the elements formed in the primary chip 1 and the secondary chips 2, 3 can be properly maintained.

Figure 3B:
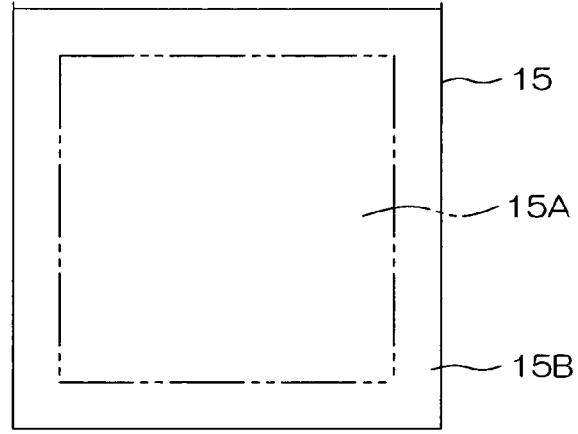

FIGS. 3(a) and 3(b) are a sectional view and a plan view, respectively, illustrating another exemplary structure of the bump B1. This exemplary structure is such that the diffusion prevention film 14 is provided only on a center region of the top surface of the bump B1 and a peripheral region of the top surface of the bump B1 is uncovered with the diffusion prevention film. The bonding film 15 covers the diffusion prevention film 14 as well as the uncovered region of the top surface of the bump B1. That is, in this exemplary structure, the bonding film 15 has an elemental material portion 15A present on the diffusion prevention film 14 in the center region and an alloy portion 15B present in a looped region (peripheral region) in contact with the top surface of the bump B1. The elemental material portion 15A is free from mutual diffusion of the bonding film material and the material (Au) for the bump B1 and, hence, is composed of elemental Sn. Therefore, the elemental material portion 15A has a melting point of about 232° C. The alloy portion 15B is composed of an Au—Sn alloy resulting from the mutual diffusion of the bonding film material and the material (Au) for the bump B1. Therefore, the alloy portion 15B has a melting point of about 280° C.

The aforementioned structure is produced by forming the diffusion prevention film 14 on the entire top surface of the bump B1 and then patterning the diffusion prevention film 14 by a lithography process.

The strength of the bonding (adhesion) between the Sn bonding film 15 and the TiW diffusion prevention film 14 is not necessarily satisfactory. Therefore, a temporary bump bonding process is first performed by utilizing the elemental material portion 15A, and then a firm bonding process is performed by utilizing the alloy portion 15B, whereby a sufficient bonding strength can be provided.

When the secondary chips 2, 3 are bonded to the primary chip 1, the bumps B2, B3 are respectively positioned with respect to the bumps B1 with their top surfaces respectively abutting against the top surfaces of the bumps B1. Then, the bonding films 15 are heated at a temperature not lower than the melting point of the bonding film material (Sn) (but lower than the melting point of Au—Sn), for example, by heating the primary chip 1. Thus, the elemental material portions 15A of the bonding films 15 are fused. Thereafter, the heating is stopped, and the bonding films 15 are cooled to be solidified, whereby the bumps B2, B3 are temporarily bonded to the bumps B1.

After the temporary bonding of the secondary chips 2, 3 to the primary chip 1, the bonding films 15 are heated at a temperature (about 280° C. or higher) at which the alloy portions 15B are fusible by heating the primary chip 1. Thus, the alloy portions 15B are fused. Thereafter, the heating is stopped, and the bonding films 15 are cooled to be solidified, whereby the bumps B2, B3 are firmly bonded to the bumps B1 via the alloy portions 15B. Thus, the bonding via the alloy portions 15B without the intervention of the diffusion prevention films 14 compensates for the insufficient strength of the bonding via the elemental material portions 15A with the intervention of the diffusion prevention films 14, thereby achieving the firm bonding.

The firm bonding process (high temperature fusion bonding process) follows the bonding of all the secondary chips 2, 3 to the primary chip 1 and, hence, is performed only once. Therefore, the number of times of the heating of the primary chip 1 and the secondary chips 2, 3 can be minimized, so that the characteristics of the elements formed in the primary chip 1 and the secondary chips 2, 3 can be properly maintained.

Figure 4A:
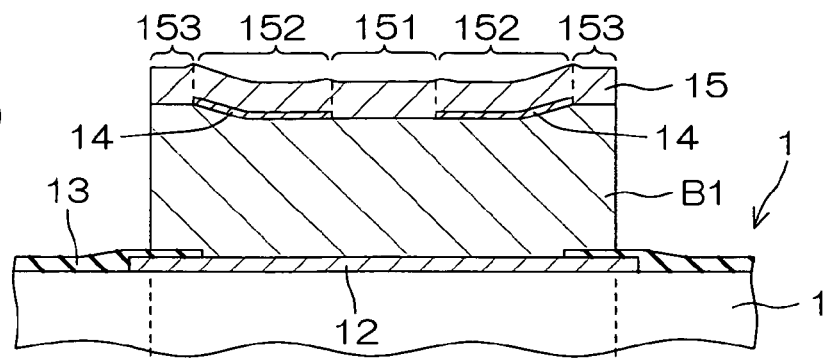
FIGS. 4(a) and 4(b) are a sectional view and a plan view, respectively, illustrating further another exemplary structure of the bump.
Figure 4B:
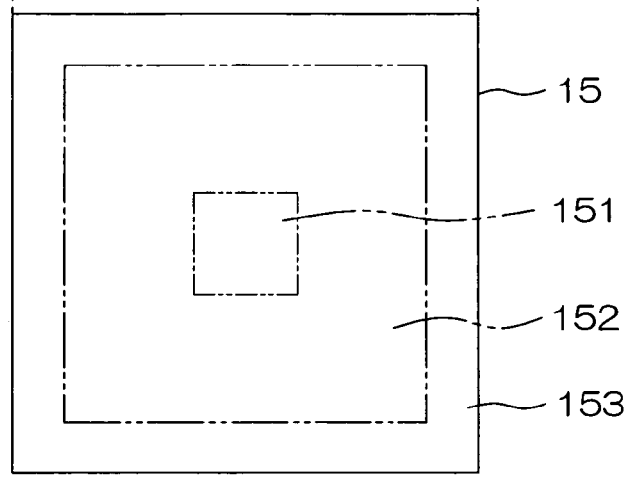

FIGS. 4(a) and 4(b) are a sectional view and a plan view, respectively, illustrating further another exemplary structure of the bump B1. This exemplary structure is such that the diffusion prevention film 14 has a looped pattern which uncovers a center region and a peripheral region of the top surface of the bump B1 and covers a remaining looped region of the top surface of the bump B1. This structure is produced by forming the diffusion prevention film 14 on the entire top surface of the bump B1 and then patterning the diffusion prevention film 14 by a lithography process.

The bonding film 15 covers the diffusion prevention film 14 and contacts the uncovered regions of the bump B1. Therefore, the bonding film 15 has a center alloy portion 151 on the center region inward of the diffusion prevention film 14, a looped elemental material portion 152 on the diffusion prevention film 14, and a peripheral alloy portion 153 outward of the diffusion prevention film 14. The elemental material portion 152 is composed of elemental Sn, and the center alloy portion 151 and the peripheral alloy portion 153 are composed of an Au—Sn alloy resulting from mutual diffusion of the material for the bump B1 and the material for the bonding film 15.

The secondary chips 2, 3 are bonded to the primary chip 1 by substantially the same bonding process as in the case of the structure of FIGS. 3(a) and 3(b). In the case of the structure of FIGS. 4(a) and 4(b), however, firm bonding can be provided in the center region and the peripheral region of the bump B1 without the intervention of the diffusion prevention film 14, so that the bonding strength can be further improved.

Figure 5A:
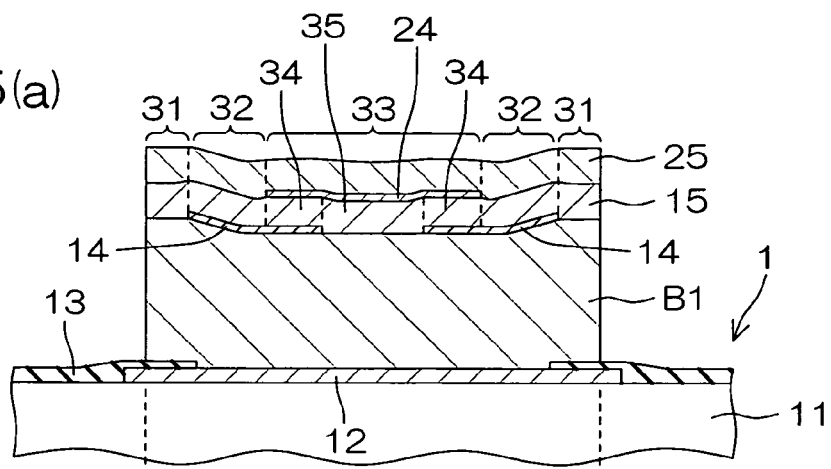
FIGS. 5(a) and 5(b) are a sectional view and a plan view, respectively, illustrating still another exemplary structure of the bump.
Figure 5B:
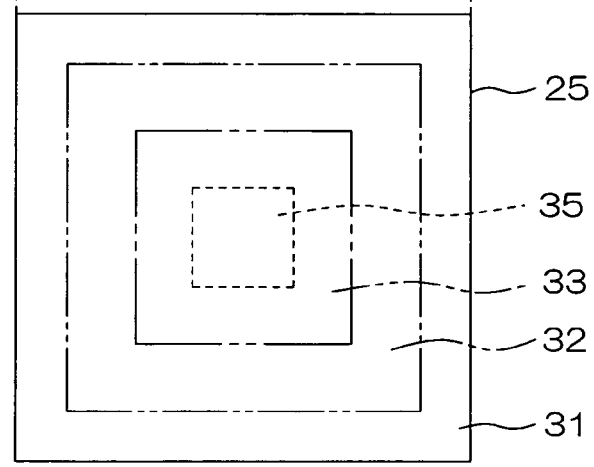

FIGS. 5(a) and 5(b) are a sectional view and a plan view, respectively, illustrating still another exemplary structure of the bump B1. This exemplary structure includes a looped first diffusion prevention film 14 (having a thickness of not smaller than 200 Å) provided on the top surface of the bump B1 as in the case of the structure of FIGS. 4(a) and 4(b), a first bonding film 15 (having a thickness of 0.1 μm to 5 μm) covering the first diffusion prevention film 14 and regions of the top surface of the bump B1 uncovered with the first diffusion prevention film, a second diffusion prevention film 24 (having a thickness of not smaller than 200 Å) provided on the first bonding film 15 as covering a center region of the first bonding film and uncovering a looped peripheral region of the first bonding film, and a second bonding film 25 (having a thickness of 0.11 μm to 5 μm) covering the second diffusion prevention film 24 and the uncovered region of the first bonding film 15. The first and second diffusion prevention films 14, 24 are each composed of TiW. The first bonding film 15 is composed of, for example, Sn, and the second bonding film 25 is composed of, for example, an Sn—In alloy. The Sn—In alloy has a melting point of about 200° C.

An Au—Sn—In alloy portion 31 resulting from diffusion of the material (Au) for the bump B1, the material (Sn) for the first bonding film 15, and the material (Sn—In) for the second bonding film 25 is present in a region outward of the first diffusion prevention film 14. An Sn-rich Sn—In alloy portion 32 resulting from mutual diffusion of the material (Sn) for the first bonding film 15 and the material (Sn—In alloy) for the second bonding film 25 is present in a looped region outward of the second diffusion prevention film 24 and inward of the alloy portion 31. An elemental material portion 33 of the Sn—In alloy (substantially free from contamination with the Au element) is present on the second diffusion prevention film 24. Further, an Sn elemental material portion 34 is present in a region between the first diffusion prevention film 14 and the second diffusion prevention film 24 (inward of the Sn-rich Sn—In alloy portion 32). An Au—Sn alloy portion 35 resulting from mutual diffusion of the material (Au) for the bump B1 and the material (Sn) for the first bonding film 15 is present in a center region inward of the first diffusion prevention film 14 immediately below the second diffusion prevention film 24.

In the case of the aforementioned structure, the Sn-rich Sn—In alloy portion 32 can be fused by heating at about 200° C., so that the temporary bonding process can be performed at a further lower temperature.

Figure 6:
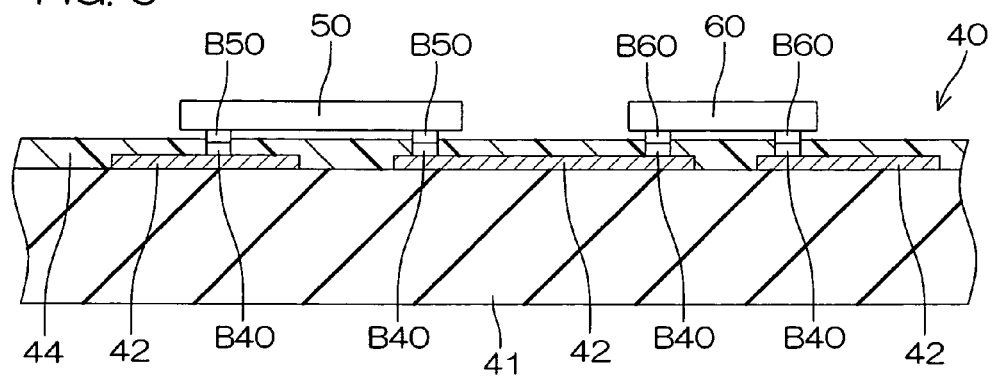
FIG. 6 is a schematic sectional view for explaining the construction of a semiconductor device according to another embodiment of the present invention.

FIG. 6 is a schematic sectional view for explaining the construction of a semiconductor device according to another embodiment of the present invention. The semiconductor device includes semiconductor chips 50, 60 flip-chip-bonded onto a surface of a wiring board 40. The wiring board 40 includes an insulating substrate 41, wiring conductors (composed of, for example, Cu) 42 provided on the insulating substrate 41, and a plurality of bumps B40 provided on the wiring conductors 42 as projecting from the wiring conductors 42. A portion of the insulating substrate 41 not formed with the bumps B40 is coated with a resist or a resin (hereinafter referred to simply as "resist") 44.

The semiconductor chips 50, 60 are bonded to the wiring board 40 with their faces down, i.e., with their active surfaces opposed to the surface of the wiring board 40. The semiconductor chips 50, 60 each have bumps B50, B60 provided on the active surface thereof. The bumps B50, B60 are respectively bonded to the bumps B40 exposed from openings formed in the resist 44, whereby the bonding of the semiconductor chips 50, 60 to the wiring board 40 is achieved.

Figure 7:
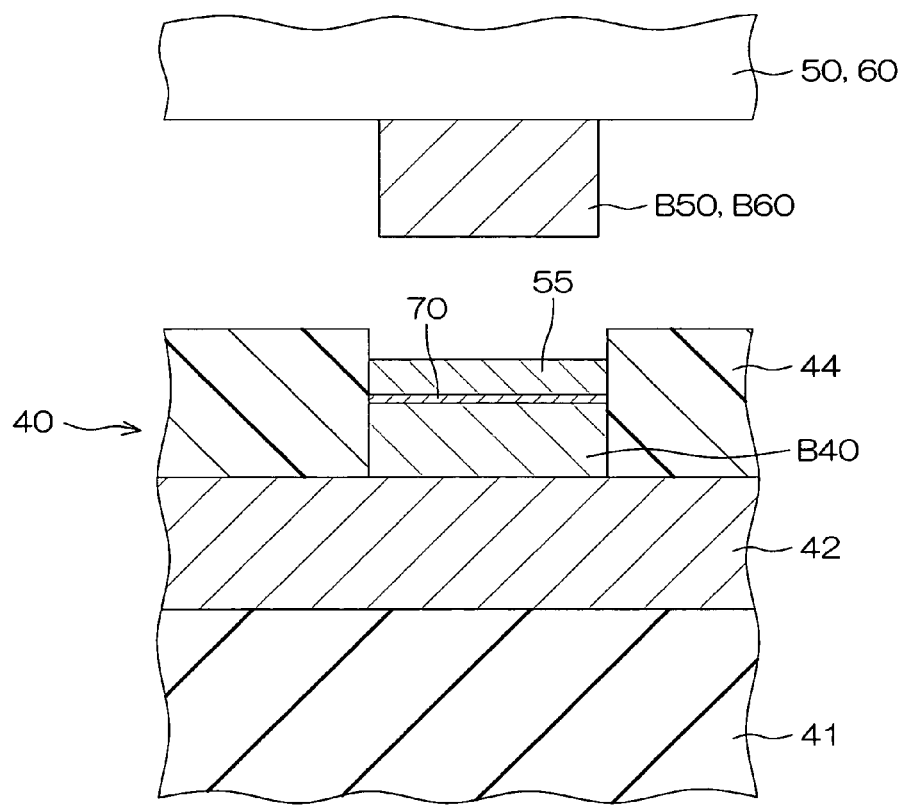
FIG. 7 is an enlarged schematic sectional view illustrating a portion of the semiconductor device of FIG. 6 around a bump provided on a wiring board.

FIG. 7 is an enlarged schematic sectional view illustrating a structure around the bump B40 on the wiring board 40. The bump B40 is composed of, for example, an Au layer formed on the wiring conductor 42 by plating. The top surface of the bump B40 is entirely covered with a diffusion prevention film 70 composed of, for example, TiW and having a thickness of not smaller than 200 Å, and a bonding film 55 composed of, for example, Sn and having a thickness of not smaller than 0.1 μm and not greater than 5 μm is provided on the diffusion prevention film 70. That is, the structure associated with the bump B40 is the same as the structure associated with the bump B1 shown in FIG. 2.

Therefore, the bonding film 55 is an elemental Sn film which is free from mutual diffusion of the material for the bump B40 and the material for the bonding film 55. Hence, the bonding films 55 on the respective bumps B40 can be fused by heating at a lower temperature on the order of the melting point (about 232° C.) of Sn to bond the bumps B50, B60 of the semiconductor chips 50, 60 to the bumps B40.

The bumps B50, B60 of the semiconductor chips 50, 60 are composed of, for example, Au. A laminate structure including a diffusion prevention film and a bonding film may be provided on a surface of each of the bumps B50, B60 but, in general, is not necessary.

Where a bonding strength provided by the adhesion between the diffusion prevention film 70 and the bonding film 55 alone is insufficient, a laminate structure as shown in FIGS. 3(a) and 3(b), FIGS. 4(a) and 4(b) or FIGS. 5(a) and 5(b) may be provided on the bump B40. In this case, the elemental material portions of the bonding films 15, 25 are fused by heating at a relatively low temperature (e.g., about 232° C.) to temporarily bond all the semiconductor chips 50, 60 to the wiring board 40, and then the Au—Sn alloy portions or the Au—Sn—In alloy portions are fused by heating at a high temperature (about 280° C.) for a short period of time to achieve the firm bonding.

Figure 8:
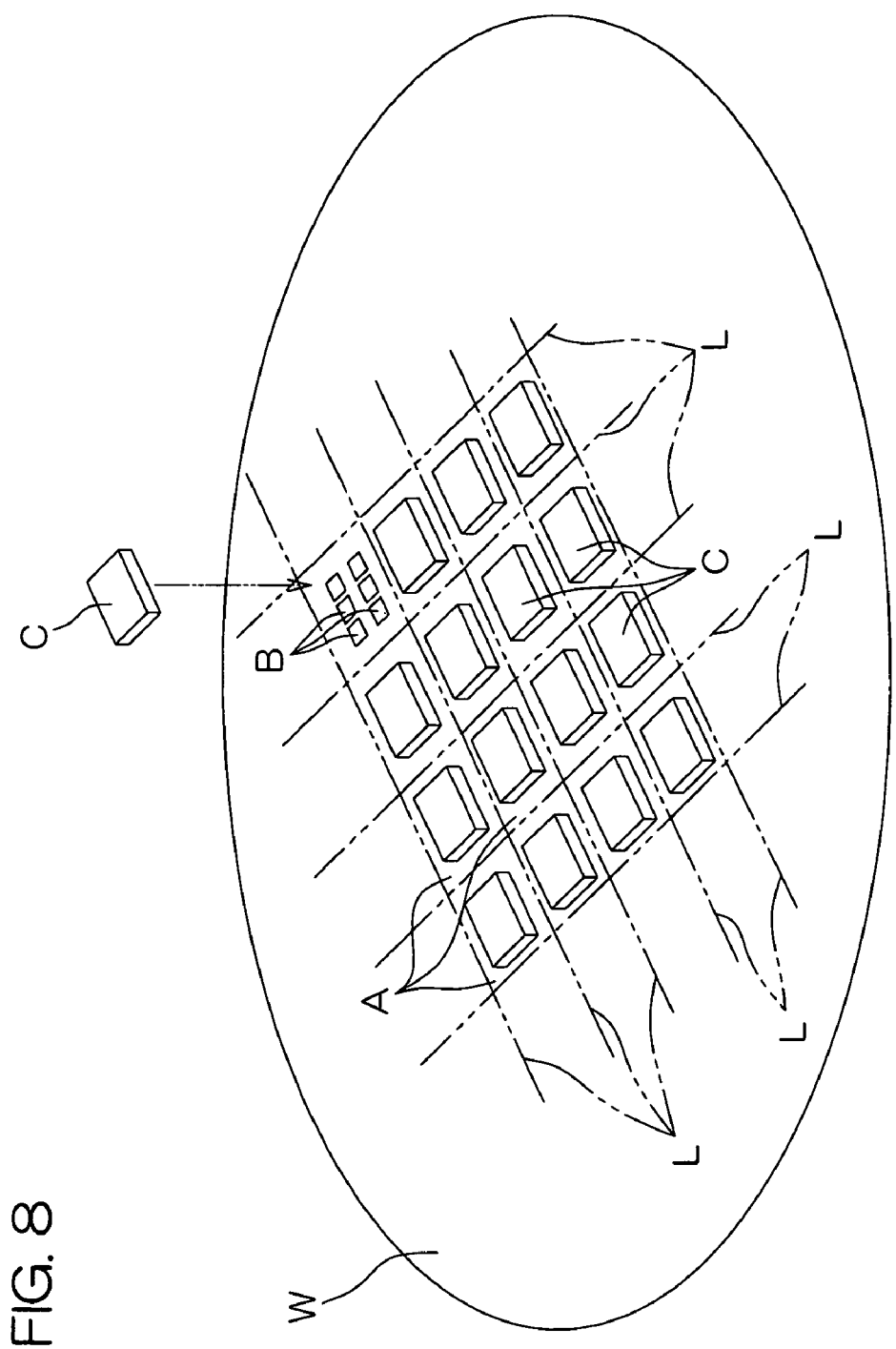
FIG. 8 is a schematic perspective view for explaining a semiconductor device production process according to further another embodiment of the present invention.

FIG. 8 is a schematic perspective view for explaining a semiconductor device production process according to further another embodiment of the present invention. In this embodiment, semiconductor devices of a chip-on-chip structure are produced. More specifically, a plurality of chip areas A for the semiconductor chips are preliminarily defined on a semiconductor wafer (e.g., a silicon wafer) W. Bumps B each having a laminate film as shown in FIGS. 3(a) and 3(b), FIGS. 4(a) and 4(b) or FIGS. 5(a) and 5(b) on a top surface thereof are preliminarily formed in each of the chip areas A. On the semiconductor wafer W of this state, the semiconductor chips C are sequentially placed in the respective chip areas A by an automatic mounting apparatus. The semiconductor chips C each have bumps (not shown) provided on a downward active surface thereof to be respectively bonded to the bumps B.

When the semiconductor chips C are sequentially placed in the chip areas A, the semiconductor wafer W is kept at a predetermined low temperature (e.g., about 232° C.) for the temporary bonding process. Thus, the elemental material portions of the bonding films on the bumps B are fused, so that the bumps of the semiconductor chips C are temporarily bonded to the bumps B.

After the semiconductor chips C are temporarily bonded in predetermined ones of the chip areas A (e.g., all the chip areas A) on the semiconductor wafer W, the semiconductor wafer W is heated at a predetermined high temperature (e.g., about 280° C.) for the firm bonding process for a predetermined short period. Thus, the alloy portions of the bonding films are fused, thereby achieving firm bonding. The period during which the semiconductor wafer W is subjected to the heating at the high temperature on the order of 280° C. is limited to a short period in the firm bonding process. Therefore, it is possible to bond the semiconductor chips C onto the semiconductor wafer W while minimizing influences on the characteristics of elements formed in the semiconductor wafer W and the semiconductor chips C.

Thereafter, the semiconductor wafer W is diced along scribe lines L thereby to be divided into the chip areas A. Thus, the semiconductor devices of the chip-on-chip structure are provided.

While three embodiments of the present invention have been described, the invention may be embodied in other ways. In the embodiments described above, the diffusion prevention film and the bonding film are provided on the top surface of each of the bumps provided on the primary chip 1, the wiring board 40 or the semiconductor wafer W. Alternatively, the diffusion prevention film and the bonding film may be provided on the top surface of each of the bumps provided on the secondary chips 2, 3, the semiconductor chips 50, 60 or the semiconductor chips C without the provision of the diffusion prevention film and the bonding film on the top surface of each of the bumps on the primary chip 1, the wiring board 40 or the semiconductor wafer W.

In the embodiments described above, all the bumps to be bonded to each other are composed of Au by way of example. Alternatively, the material for the bumps may be Cu, for example, and the bumps to be bonded to each other are not necessarily composed of the same material. That is, Au bumps may be bonded to Cu bumps, for example, via the bonding films.

Further, the bumps are not necessarily provide on both of the electronic devices (the wiring board and the semiconductor chip) to be bonded to each other, but may be provided on either one of the electronic devices. Where the semiconductor chip is flip-chip-bonded onto the wiring board, for example, the bumps may be provided only on the semiconductor chip, and bonded to the wiring conductor on the wiring board. In this case, the laminate structure including the diffusion prevention film and the bonding film may be provided on the top surface of each of the bumps on the semiconductor chip.

In the embodiments described above, Sn or the Sn—In alloy are employed as the material for the bonding films by way of example. Alternatively, indium (In) may be employed. In general, a bonding film having a lower melting point than the bump material is provided on the top surface of each of the bumps. More specifically, exemplary combinations of the bonding film material and the bump material include Sn/Au, Sn/Cu, In/Au, In/Cu, and In/Sn.

In the embodiments described above, the TiW film is employed as the diffusion prevention film by way of example. Alternatively, an Ni film, a Ti film or a Cr film may be employed as the diffusion prevention film. Where any of these films is employed, however, the film preferably has a thickness of not smaller than 200 Å to provide a sufficient diffusion prevention function.

In the case of the construction shown in FIGS. 6 and 7, Ni films are preferably provided between the Cu wiring conductors 42 and the Au bumps B40 to suppress mutual diffusion between the Cu wiring conductors 42 and the Au bumps B40.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2004-234707 filed with the Japanese Patent Office on Aug. 11, 2004, the disclosure of which is incorporated herein by reference.

What is claimed is:

1. An electronic device comprising:
a substrate;
a bump of a first metal material provided on a surface of the substrate;
a bonding film of a second metal material provided on a top surface of the bump for bonding the electronic device to an electrical connection portion of a second device; and
a diffusion prevention film of a third metal material provided between the top surface of the bump and the bonding film, the diffusion prevention film partially covering the top surface of the bump, and the bonding film having a first portion in direct contact with the diffusion prevention film and a second portion in direct contact with the top surface of the bump.

2. The electronic device as set forth in claim 1, wherein the substrate is a semiconductor substrate, and the electronic device is a semiconductor chip.

3. The electronic device as set forth in claim 1, wherein
the substrate is a wiring board having a wiring conductor provided on an insulating substrate, and
the bump is provided on the wiring board and connected to the wiring conductor.

4. A semiconductor device of a chip-on-chip structure comprising a first semiconductor chip and a second semiconductor chip respectively having bumps and connected to each other with the bumps thereof bonded to each other, wherein
   at least one of the first semiconductor chip and the second semiconductor chip is the electronic device as recited in claim 2.

5. A semiconductor device comprising:
   a wiring board having a wiring conductor provided on an insulating substrate; and
   the electronic device as recited in claim 2, the electronic device being connected to the wiring conductor with the bump thereof opposed to the wiring board.

6. The electronic device as set forth in claim 1, wherein the second metal material has a lower melting point in an elemental state than an alloy of the first metal material and the second metal material.

7. The electronic device as set forth in claim 1, wherein the third metal material has a lower diffusion coefficient than the second metal material with respect to the first metal material.

8. The electronic device as set forth in claim 1, wherein the first metal material is Au or Cu.

9. The electronic device as set forth in claim 1, wherein the second metal material is Sn, In, or an Sn-In alloy.

10. The electronic device as set forth in claim 1, wherein the third material is TiW.

* * * * *

UNITED STATES PATENT AND TRADEMARK OFFICE
CERTIFICATE OF CORRECTION

| | | |
|---|---|---|
| PATENT NO. | : 7,612,456 B2 | Page 1 of 1 |
| APPLICATION NO. | : 10/577450 | |
| DATED | : November 3, 2009 | |
| INVENTOR(S) | : Fujii et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 630 days.

Signed and Sealed this

Nineteenth Day of October, 2010

David J. Kappos
*Director of the United States Patent and Trademark Office*